(12) United States Patent
Min et al.

(10) Patent No.: US 6,351,355 B1
(45) Date of Patent: Feb. 26, 2002

(54) SPIN VALVE DEVICE WITH IMPROVED THERMAL STABILITY

(75) Inventors: Tai Min; Hua-Ching Tong, both of San Jose; Yiming Huai, Pleasanton; Wengie Chen, Cupertino, all of CA (US)

(73) Assignee: Read-Rite Corporation, Fremont, CA (US)

( * ) Notice: Subject to any disclaimer, the term of this patent is extended or adjusted under 35 U.S.C. 154(b) by 0 days.

(21) Appl. No.: 09/247,814

(22) Filed: Feb. 9, 1999

(51) Int. Cl.$^7$ ............................................. G11B 5/127
(52) U.S. Cl. .......................... 360/324.11; 360/324.12
(58) Field of Search ........................... 360/315, 324.11, 360/324, 320, 324.12, 324.1, 323, 322, 314, 327.32, 327.3, 325

(56) References Cited

U.S. PATENT DOCUMENTS

| | | | | |
|---|---|---|---|---|
| 5,465,185 A | * | 11/1995 | Heim et al. | 360/324.11 |
| 5,508,867 A | * | 4/1996 | Cain et al. | 360/324.11 |
| 5,574,605 A | * | 11/1996 | Baumgart et al. | 360/324.11 |
| 5,583,725 A | * | 12/1996 | Coffey et al. | 360/324.11 |
| 5,701,223 A | * | 12/1997 | Fontana, Jr. et al. | 360/324.11 |
| 5,742,458 A | * | 4/1998 | Koike et al. | 360/324.11 |
| 5,768,071 A | * | 6/1998 | Lin | 360/324.11 |
| 5,828,529 A | * | 10/1998 | Gill | 360/324.11 |
| 5,862,021 A | * | 1/1999 | Deguchi et al. | 360/324.11 |
| 5,867,351 A | * | 2/1999 | Gill | 360/324.11 |
| 5,880,913 A | * | 3/1999 | Gill | 360/324.11 |
| 5,898,549 A | * | 4/1999 | Gill | 360/324.11 |
| 6,038,107 A | * | 3/2000 | Pinarbasi | 360/324.11 |

OTHER PUBLICATIONS

U.S. Patent application Ser. No. 09/227,323, By Tong, et al., filed on Jan. 6, 1999, entitled, "Spin Valve Sensor with Improved Pinning Structure."

* cited by examiner

*Primary Examiner*—Allen Cao
(74) *Attorney, Agent, or Firm*—Carr & Ferrell LLP; Robert D. Hayden

(57) ABSTRACT

The present invention provides spin valve with a magnetic compensation field which couples to the pinned layer and counteracts sensing current induced magnetic field. The spin valve sensor of the present invention may be formed having a structure comprising: a free layer, a first spacer layer, a pinned layer, a pinning layer, a second spacer layer, and a compensation layer. The compensation layer may be formed of ferromagnetic material with its magnetization set so that the compensation field oriented in a reinforcing relationship with the magnetization of the pinned layer. Current through the compensation layer and the spacer layer may add to the compensation field. The spacer layer may be formed of a nonmagnetic material of sufficient thickness to prevent interaction between the pinning layer and the compensation layer while providing a sufficiently small distance to allow sufficient magnetic coupling to the pinned layer. The present invention may be used to improve thermal stability and reduce Barkhausen noise while not impacting output symmetry.

10 Claims, 2 Drawing Sheets

SPIN VALVE DEVICE WITH IMPROVED THERMAL STABILITY

BACKGROUND

1. Field of the Invention

The present invention relates to the field of spin valve sensors.

2. Background Art

Spin valve sensors exploit changes in electrical resistance which occurs as a result of manipulating the relative orientation of the magnetization of ferromagnetic layers within a spin valve sensor. In conventional spin valve sensors, one ferromagnetic layer has its magnetization pinned while another, which has its magnetization set perpendicular to the pinned layer, is free to change its magnetic orientation in response to magnetized bits on an adjacent recording media. The magnetized bits on the recoding media, therefore, change the relative magnetization direction of the free layer with respect to the pinned layer. A current through the spin valve is used to detect changes in the resistance of the spin valve that results from changes in the relative magnetization of the free layer. Typically, the magnetic field of the free layer is set perpendicular to the magnetization of its pinned layer to provide a symmetrical operating point for the spin valve.

The sensing current, does itself create undesirable effects within the spin valve. The current through the spin valve generates resistive heat in the spin valve sensor. The heat can cause the instability and noise within the sensor.

Typically, an antiferromagnetic pinning layer, adjacent the pinned layer, pins the magnetic moment of the pinned layer. As the temperature of the pinning layer increases, the pinning field decreases. If the temperature of the sensor rises above the blocking temperature of the pinning layer, the pinning layer is no longer able to pin the magnetization of the pinned layer and may have its exchange coupling altered, causing the magnetization of the pinned layer to weaken, or change.

Turning to FIG. 1, another problem encountered with spin valves is Barkhausen noise. Barkhausen noise is caused as the magnetic field 301 & 302 from the magnetic media 210 passes the pinned layer 110. The magnetic field 301 & 302 from the media 210 causes domain walls 106 within the pinned layer 110 to shift, as illustrated in FIG. 1, temporarily changing the resistance of the pinned layer 110. Increased temperature and its corresponding reduction of the pinning field further intensifies Barkhausen noise by allowing the domain walls 116 to more easily move within the pinned layer 110.

Furthermore, the sensing current through the spin valve, particularly in the spacer layer between the pinned and free layers, induces a magnetic field which opposes the magnetic field of the pinned layer. This current induced magnetic field further reduces the strength of the pinned field and further contributes to Barkhausen noise. Moreover, this field can change the orientation of the pinned layer if the temperature of the pinned layer rises above its blocking temperature, thereby causing permanent damage to the spin valve.

Some of the above problems are also noted in U.S. Patent application Ser. No. 09/227,323, by Tong, et al., filed on Jan. 6, 1999, entitled SPIN VALVE SENSOR WITH IMPROVED PINNING STRUCTURE, issued as U.S. Pat. No. 6,185,077, on Feb. 6, 2001, herein incorporated by reference in its entirety.

Although the magnitude, or direction, of the current through the spin valve may be changed to improve the magnetization characteristic of the pinned layer and to reduce Barkenhausen noise, it would also undesirably change the operating point of the spin valve and lead to asymmetrical output.

SUMMARY OF THE INVENTION

The presently preferred embodiment of the spin valve of the present invention provides a magnetic compensation field within the spin valve. The compensation field extends or couples to the pinned layer so that it is in a reinforcing relationship with the magnetic moment of the pinned layer. The compensation field may be used to counteract any sensing current induced magnetic field, and its effects on the pinned layer.

The spin valve sensor of the present invention may be formed having a structure comprising: a free layer, a first spacer layer, a pinned layer, a pinning layer, a second spacer layer, and a compensation layer. The compensation layer may be formed of any known ferromagnetic material. The spacer layer may be formed of a nonmagnetic material of sufficient thickness to prevent pinning of the compensation layer by the pinning layer while providing a sufficiently small distance between compensation layer and the pinned layer to allow sufficient magnetic coupling to reduce the current induced magnetic field at the pinned layer.

The compensation field may be formed by setting the magnetic moment of the compensation layer during deposition, by depositing an adjacent layer having a set magnetization, by passing current through the compensation layer or through the spacer layer, or by any other techniques known in the art. The compensation field, however, is not derived from the pinning layer.

The spin valve sensor of the present invention may be utilized to provide an improved data storage and retrieval apparatus.

The present invention may be used to improve thermal stability and reduce Barkhausen noise while not impacting output symmetry.

DETAILED DESCRIPTION OF THE PREFERRED EMBODIMENTS OF THE INVENTION

Figure 1:
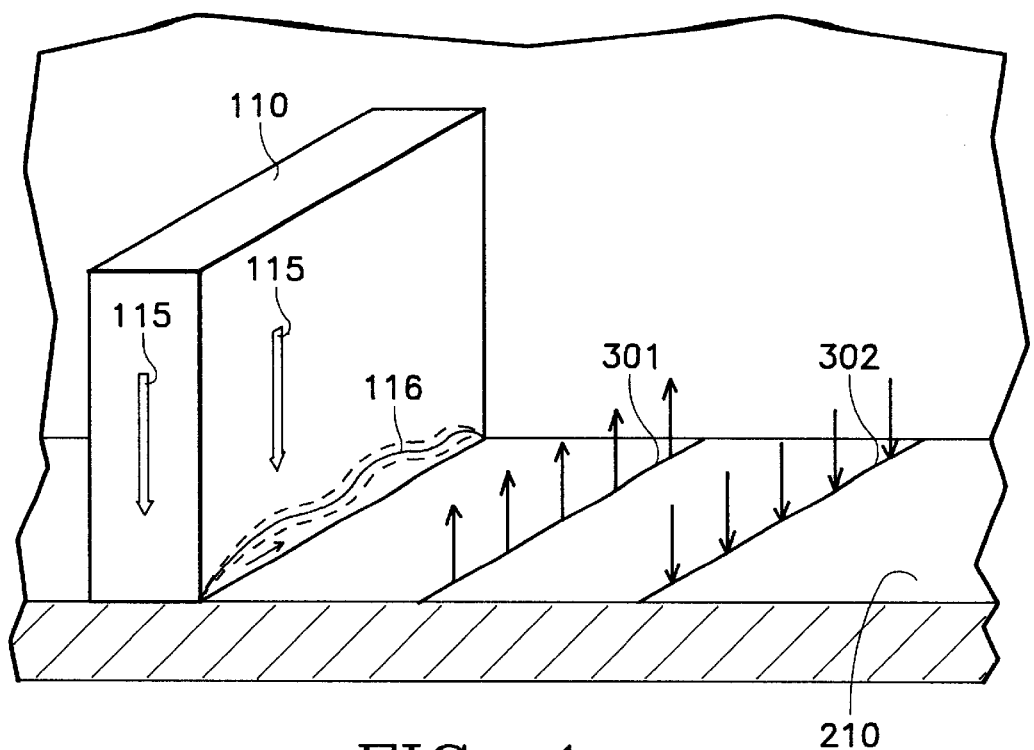
FIG. 1 illustrates a pinned layer of a spin valve device located above a recording media in exploded perspective view.
Figure 2:
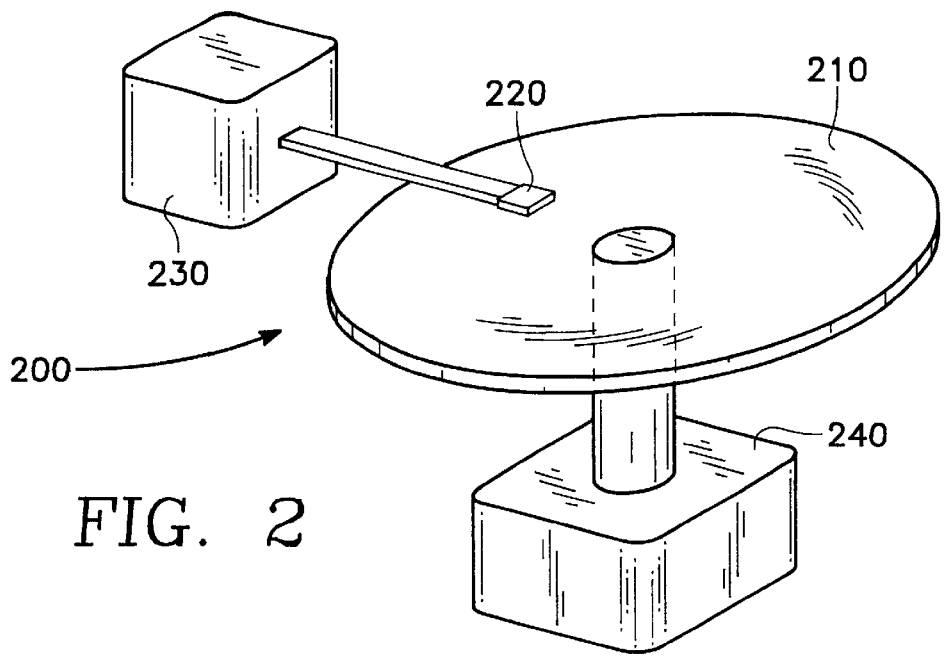
FIG. 2 illustrates a disk type magnetic data storage and retrieval apparatus.

FIG. 2 shows the improved spin valve sensor of the present invention embodied in a disk type magnetic data storage and retrieval apparatus 200. The improved spin valve of the present invention may be located within a merged head assembly 220 which rides above a magnetic storage media 210, depicted in FIG. 2 as a rotatable hard disk type storage media. The hard disk is coupled to a motor 240 to provide rotation of the disk relative to the head assembly 220. An actuating means 230 may be used to position the head assembly 220 above the surface of the media 210 to read and write data in the form of magnetic bits from and to the media 210. The data storage and retrieval apparatus 200, typically has several hard disks 210 and several corresponding head assemblies 220.

Figure 3:
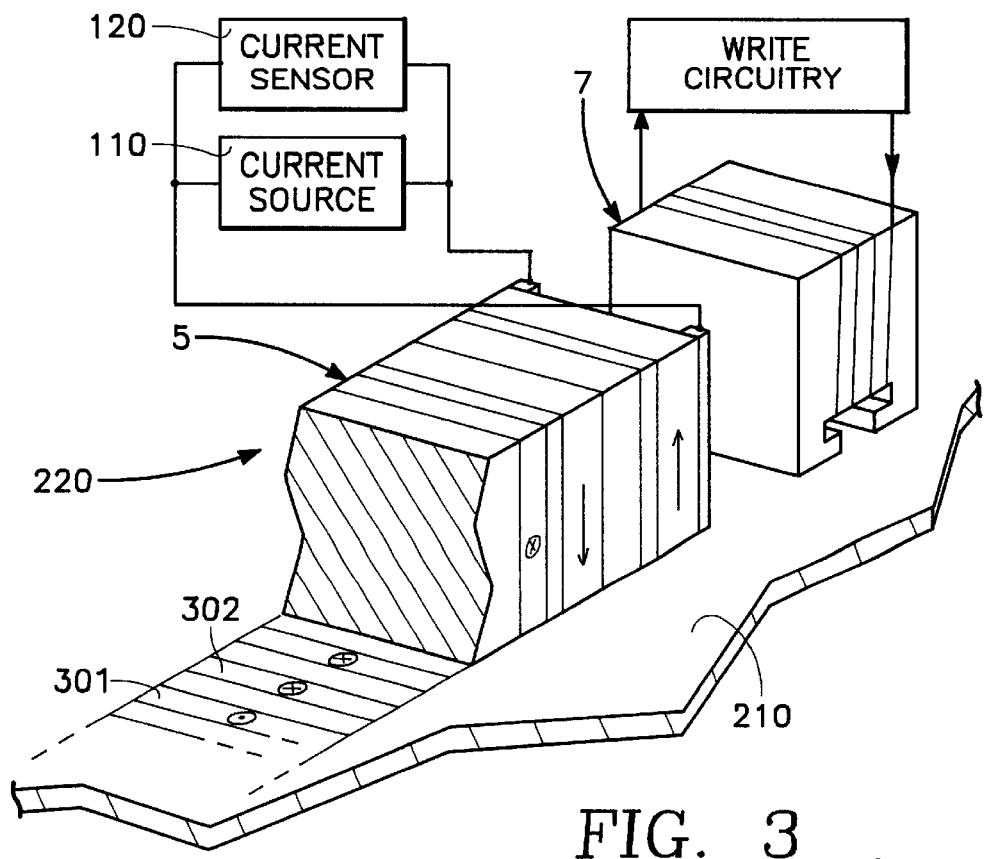
FIG. 3 is a simplified functional illustration of a head assembly shown in exploded perspective view.

FIG. 3 shows a simplified functional illustration of the head assembly 220. Merged head assemblies 220 are formed having a write head 7, used to write or set the magnetization of bits 301, 302 on the media 210, while a read head 5, reads the magnetization of those bits 301, 302 from the media 210. The depiction in FIG. 3 is a functional representation of a merged head, the merged head of the present invention may be formed by techniques well know in the art, such as by masking, depositing, and etching successive layers to form the well known structures of the merged head 220.

Figure 4:
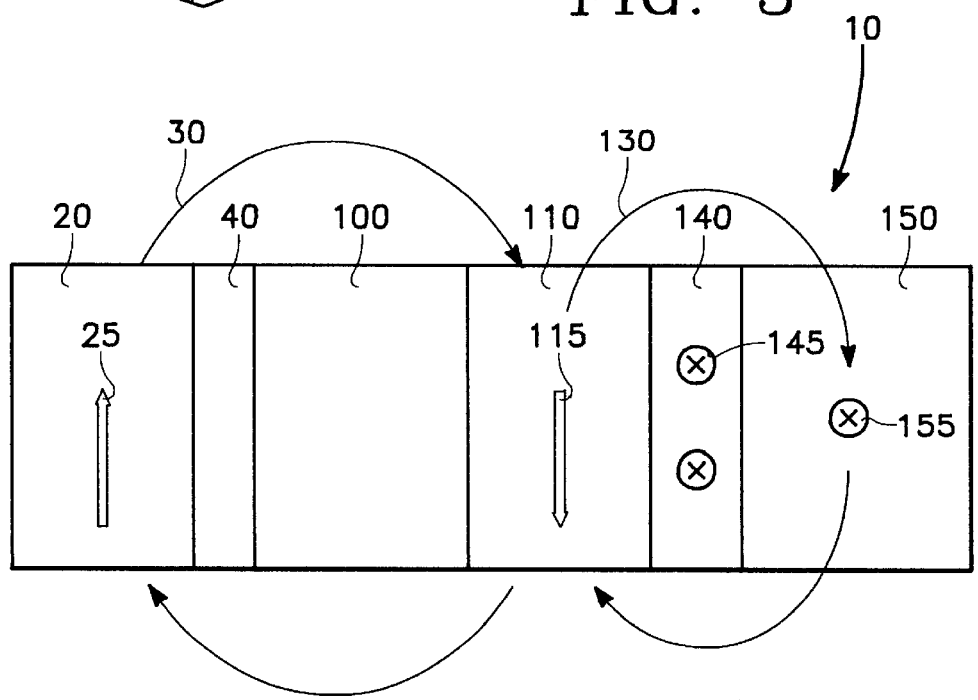
FIG. 4 is a sectional view of a spin valve sensor in accordance with a preferred embodiment of the present invention.

Turning to FIG. 4, the present invention utilizes an improved spin valve device 10. The structure of the spin valve 10 of the present invention may comprise: a compensation layer 20, a spacer layer 40, a pinning layer 100, a pinned layer 110, a spacer layer 140, and free layer 150. The spin valve 10 of the present invention may be fabricated using techniques well known in the art. Sputtering, for example, may be used to deposit the layers 20–150.

The pinning layer 100, typically is formed of an antiferromagnetic material, such as FeMn, IrMn, NiMn, PtMn, PtPdMn, or any other Mn based antiferromagnetic material. It is also possible to use other known antiferromagnetic materials such as NiO, NiMn, NiCoO, or the like, or any known antiferromagnetic material. The domain state of the antiferromagnetic or AFM pinning layer 100 may be set after deposition by heating the pinning layer 100 above its blocking temperature and then cooling it in the presence of an applied magnetic field. The applied magnetic field aligns the domain state of the adjacent pinned layer 110 as temperature drops below the blocking temperature. Setting the domain state of the pinning layer 100 by this annealing process may be done after all the layers 20–150 have been deposited.

The pinning layer 100 is used to pin the magnetic moment of the pinned layer 110 as indicated by arrow 115. The spacer layer 140 separates the free layer or layers 150 from the pinned layer 110. The magnetic moment 155 of the free layer 150 is weakly set perpendicular to the pinned layer, by an adjacent layer (not shown), so that the free layer 150 may rotate in the presence of the magnetic field of the media. A current source and current sensor are used to detect changes in the relative magnetization of the pinned and free layers 110 & 150.

The current 145 flow in the spin valve sensor produces heat due to resistive heating. The current 145 produces a magnetic field 130. As the magnetic field 115 of the pinned layer 110 may affect the orientation of the magnetic moment 155, the current-generated magnetic field 130 may be used to bias the magnetization of the free layer 150 perpendicular to the pinned layer 110 to maintain a symmetrical output.

It is important to note that the current induced magnetic field 130 at the pinned layer 110 is oriented in the opposite direction of the pinned layer magnetization 115. This further weakens the magnetization 115 of the pinned layer 110 and increases Barkhausen noise. This problem is further intensified as the temperature of the pinning layer 100 is increased. Although reducing the current 145 through the spin valve would reduce the Barkhausen noise by reducing temperature and the magnetic field 130, it would correspondingly shift the bias point undesirably causing an asymmetrical output.

The compensation layer 20 of the present invention provides a magnetic compensating field 30 which counteracts the effects of the current-generated magnetic field 130 at the pinned layer 110. The magnetic compensating field 30 may be produced by providing the compensation layer 20 with a magnetization 25. The magnetization 25 is oriented so that it is in a reinforcing relationship with the magnetization 115 of the pinned layer 110. The magnetization 25 of the compensation layer 20 may be set by any of the following means: during deposition of the compensation layer 20; by depositing an adjacent layer (not shown) and setting its magnetization during its deposition; by allowing a portion of the sensing current to pass through the compensation layer, or the spacer layer 40; by passing a separate current through the compensation layer, or the spacer layer; or by any other technique known in the art. The compensating field 30 may counteract the current induced magnetic field 130 by completely canceling, or only partially canceling, the current induced magnetic field 130 and its effects on the pinned layer 110. It is preferred that the magnetic field 30 be formed greater than the current induced magnetic field 130 at the pinned layer 110 so that it reinforces the magnetization 115 of the pinned layer 110. Reinforcing the magnetization 115 of the pinned layer 110 improves the stability of the spin valve.

The compensation layer 20 may be formed of a single layer or of several layers to form the compensating field 30 and may be formed of any ferromagnetic material known in the art. For example, it may be formed of Ni, Fe, Co, or their alloys. The thickness of the compensation layer 20, and the magnitude and direction of the magnetization 25 of the compensation layer 20, are selected so that the compensating field 30 is sufficient to reduce the effects of the current-generated magnetic field 130 on the pinned layer 110, while not significantly altering output symmetry of the spin valve or the magnetic state of the media.

The compensating field 30 of the present invention improves the stability of the pinned layer 110. By counteracting the current induced magnetic field 130, domain wall movement is reduced thereby reducing Barkhausen noise. The benefit derived from counteracting the current induced magnetic field 130 increases as the operating temperature of the spin valve increases.

Moreover, it is possible to select the magnitude and orientation of the compensating field 30 so that the compensating field reinforces the magnetic moment 115 of the pinned layer 110. By reinforcing the magnetic moment 115 of the pinned layer 110, the compensating field 30, provides addition magnetization in the pinned layer 110 along the direction of the magnetization 115 of the pinned layer 110 to inhibit the movement of the domain walls as the temperature of the pinning layer 100 increases. This reduces Barkhausen noise and provides a more thermally stable spin valve 10.

Furthermore, providing the compensating field 30 so it reinforces the magnetic moment 115 of the pinned layer 110, can prevent permanent demagnetization of the pinned layer 110 should the pinning layer 100 rise above its blocking temperature. The present invention, therefore, may provide improved thermal stability for the spin valve 10 above its blocking temperature and prevent resetting of the pinning layer 100.

The spacer layer 40 is formed to prevent the pinning layer 100 from controlling the magnetization of the compensation layer 20. As such, the spacer layer 40 may be formed of a nonmagnetic material of sufficient thickness to prevent the pinning layer 100 from pinning the magnetization of the compensation layer 20. The spacer layer is preferably formed having high electrical resistance. The spacer layer 40 may be formed of an ultra thin layer of tantalum, preferably in its high resistivity P phase. It is also possible to form the spacer layer 40 of copper. Forming the spacer layer 40 thin, decreases its resistance, and decreases the distance between the spacer layer 40 and the pinned layer 110, thus decreasing leakage current through the spin valve device and improving the magnetic coupling of the compensating field 30 between the layers.

Although in some embodiments it is preferred to maximize the resistance of the spacer layer 40, in other embodiments a magnetic field generated by current flowing through the spacer layer 40 may add to, or be the sole source of, the compensation field 30. In such a case, compensation layer 20 may be considered to comprise the spacer layer 40.

It is important to note that with the present invention, the magnetic compensating field 30 is not generated by the AFM pinning layer 100. That is to say, generation or formation of the magnetic compensating field 30 is decoupled from the pinning layer 100. The magnetic compensating field 30, therefore, is not derived from the pinning layer 100, or the pinned layer 110.

The spin valve 10 may be formed on a substrate (not shown) such as silicon, glass, or ceramic. A seed layer (not shown) may be deposited over the substrate to provide a suitable lattice structure for better controlling the structure and deposition of subsequent layers. It is preferred to deposit tantalum as the seed layer so that it forms with high resistivity in its β0 phase. It is also possible to use any other material providing high resistivity, good thermal stability, and zero magnetic moment, for the seed layer.

While the preferred embodiments of the present invention have been described in detail above, many changes to these embodiments may be made without departing from the true scope and teachings of the present invention. The present invention, therefore, is limited only as claimed below and the equivalents thereof.

What we claim is:

1. A spin valve sensor comprising:
   a pinned layer having a magnetic moment;
   a free layer;
   a first spacer layer located between the free layer and the pinned layer;
   a pinning layer adjacent the pinned layer;
   a compensation layer, the pinning layer being located between the compensation layer and the pinned layer; and
   a second spacer layer disposed between the pinning layer and the compensation layer,
   wherein the first spacer layer is capable of sustaining a flow of electrical current, the current being capable of generating a magnetic field extending to the pinned layer, and wherein the compensation layer is capable of providing a magnetic field extending to the pinned layer, the magnetic field provided by the compensation layer being capable of counteracting the current generated magnetic field at the pinned layer.

2. The spin valve sensor of claim 1 wherein the compensation layer comprises a ferromagnetic material.

3. A data storage and retrieval apparatus comprising:
   a magnetic recording media;
   a head assembly positioned adjacent the magnetic recording media comprising:
   a write head;
   a spin valve read head comprising:
      a pinned layer having a magnetic moment;
      a free layer;
      a first spacer layer between the pinned layer and the free layer;
      a pinning layer adjacent the pinned layer; and
      a compensation layer capable of providing a magnetic compensation field, the compensation layer being magnetically decoupled from tie pinning layer, the pinning layer being located between the compensation layer and the pinned layer;
   wherein the first spacer layer is capable of sustaining a flow of electrical current, the current being capable of generating a magnetic field extending to the pinned layer, the compensation layer magnetic field being capable of counteracting the current generated magnetic field extending to the pinned layer; and
   a motor coupled to the media so as to move the media with respect to the head assembly.

4. The data storage and retrieval apparatus of claim 3 further comprising a second spacer layer located between the pinning layer and the compensation layer.

5. The data storage and retrieval apparatus of claim 4 wherein the compensation layer magnetic field adjacent the pinned layer is oriented in a reinforcing relationship with the magnetization of the pinned layer.

6. The apparatus of claim 3 wherein the compensation layer comprises a ferromagnetic material.

7. A spin valve sensor comprising:
   a) a pinned layer having a magnetic moment;
   b) a free layer;
   c) a first spacer layer located between the free layer and the pinned layer;
   d) a pinning layer adjacent the pinned layer;
   e) a compensation layer;
   f) a second spacer layer disposed between the pinning layer and the compensation layer; and
   g) wherein the first spacer layer is capable of sustaining a flow of electrical current, the current being capable of generating a magnetic field extending to the pinned layer, and wherein the compensation layer is capable of providing a magnetic field extending to the pinned layer, the magnetic field provided by the compensation layer being capable of counteracting the current generated magnetic field at the pinned layer.

8. A data storage and retrieval apparatus comprising:
   d) a magnetic recording media;
   e) a head assembly positioned adjacent the magnetic recording media comprising:
      (i) a write head; and
      (ii) a spin valve read head comprising:
         (1) a pinned layer having a magnetic moment;
         (2) a free layer;
         (3) a first spacer layer between the pinned layer and the free layer;
         (4) a pinning layer adjacent the pinned layer; and
         (5) a compensation layer capable of providing a magnetic compensation field, the compensation layer being magnetically decoupled from the pinning layer; and f) a motor coupled to the media so as to move the media with respect to the head assembly;

g) wherein the first spacer layer is capable of sustaining a flow of electrical current, the current being capable of generating a magnetic field extending to the pinned layer, the compensation layer magnetic field being capable of counteracting the current generated magnetic field extending to the pinned layer.

9. The apparatus of claim 8 further comprising a second spacer layer located between the pinning layer and the compensation layer.

10. The apparatus of claim 9 wherein the compensation layer magnetic field adjacent the pinned layer is oriented in a reinforcing relationship with the magnetization of the pinned layer.

\* \* \* \* \*